United States Patent
James

(10) Patent No.: US 7,755,349 B2
(45) Date of Patent: Jul. 13, 2010

(54) CORRECTING OFFSET IN MAGNETO-RESISTIVE DEVICES

(75) Inventor: John J James, Felton, CA (US)

(73) Assignee: MEMSIC, Inc., Andover, MA (US)

( * ) Notice: Subject to any disclaimer, the term of this patent is extended or adjusted under 35 U.S.C. 154(b) by 56 days.

(21) Appl. No.: 12/041,037

(22) Filed: Mar. 3, 2008

(65) Prior Publication Data

US 2009/0219011 A1 Sep. 3, 2009

(51) Int. Cl.
G01B 7/14 (2006.01)
G01R 33/02 (2006.01)

(52) U.S. Cl. .................. 324/207.13; 324/252

(58) Field of Classification Search ............. 324/117 R, 324/252, 253, 207.16, 244, 247, 249, 254, 324/255, 258, 260, 207.13
See application file for complete search history.

(56) References Cited

U.S. PATENT DOCUMENTS

| | | | |
|---|---|---|---|
| 4,403,515 A | 9/1983 | Iwasaki | |
| 4,851,775 A | 7/1989 | Kim et al. | |
| 5,239,264 A | 8/1993 | Hawks | |
| 5,334,935 A | 8/1994 | Cook | |
| 5,351,004 A | 9/1994 | Daniels et al. | |
| 5,519,318 A | 5/1996 | Koerner et al. | |
| 5,642,046 A | 6/1997 | Hawks | |
| 5,694,952 A | 12/1997 | Lidman et al. | |
| 5,757,184 A | 5/1998 | Kurihara | |
| 6,084,406 A * | 7/2000 | James et al. | 324/253 |
| 6,445,171 B2 * | 9/2002 | Sandquist et al. | 324/117 R |
| 7,112,793 B2 | 9/2006 | Wright | |

OTHER PUBLICATIONS

H. Hauser et al., *Magnetoresistive Sensors*, Elektrotechnik und Informationstechnik, 1998, pp. 382-390, vol. 115, No. 7/8, Springer Verlag, Austria.

\* cited by examiner

*Primary Examiner*—Reena Aurora
(74) *Attorney, Agent, or Firm*—Weingarten, Schurgin, Gagnebin & Lebovici LLP

(57) ABSTRACT

Method and apparatus improve sensing accuracy and reduce bias shift in anisotropic magneto-resistive sensors using paired integrators and sampling switches for processing outputs of the sensor on applied set and reset signals with high immunity to temperature variations.

5 Claims, 2 Drawing Sheets

CORRECTING OFFSET IN MAGNETO-RESISTIVE DEVICES

FIELD OF THE INVENTION

This invention relates to anisotropic magneto-resistive sensors, and more particularly to apparatus and method for reducing bias offset and temperature sensitivity in such sensors operating in host systems.

BACKGROUND OF THE INVENTION

Anisotropic magneto-resistive (AMR) sensors are used in many devices from compasses to steering and positioning devices. These sensors include resistive bridges to provide accurate measurements of weak magnetic fields. (See, for example, U.S. Pat. No. 5,519,318). However, this type of sensor has an inherent offset bias voltage caused by mismatches within the resistive bridge. One scheme for removing this offset is to provide an offset current back into an amplifier connected to the bridge. This offset current is selected for each individual device and selecting the current value can be time consuming for devices used in systems that are mass produced.

Another scheme to reduce the offset is to correct it in the digital domain. The output of the sensor circuit is digitized with an Analog to Digital converter. For example, using the SET and RESET functions on an AMR sensor, 2 measurements are made and then the offset is determined mathematically as (Vset+Vreset)/2. This equation yields the offset voltage and must be subtracted from each measurement using 3 measurements to complete one reading. Another scheme switches between the Set and Reset controls at a fixed rate and uses an integrator to remove the offset. The integrator frequency must be set far below the toggle frequency to extract the offset value and feed it back to a sensor amplifier. This scheme requires extra components and causes the circuit to be physically larger and operationally slower.

Another scheme to reduce the offset includes a servo mechanism which adds complexity and reduces bandwidth due to roll-off response of the integrator involved. And, there may be a critical ratio of clocking frequency to integrator cut-off frequency due to the fact that the bias voltage shows up as an AC signal to the input of the integrator. If the integrator frequency is too high, the sensor bias appears as an AC voltage on the servo feedback voltage. The integrator is used to filter out the AC bias term. A general rule of thumb for clock to integrator cutoff frequencies is 10 times. This limits the useful bandwidth of the sensor. For a wide bandwidth magnetometer, the clock would have to be at least 10 times higher than the integrator frequency and still be stable for the servo operation. The downside of increasing the clock frequency is the power consumption increases and self heating of the sensor bridge may start to affect the operation of the circuit.

All of these conventional schemes described above work for the reduction of V offset, but cause extra steps to be taken to make these sensors useful. Most of the above schemes require a micro processor to perform the calculations. Some schemes can also reduce the available bandwidth or resolution of the sensor circuit. In the digital subtraction scheme, there is also a loss in dynamic range caused by the subtraction of the Vset and Vreset voltages.

Several known schemes of bias reduction all have various draw backs either reducing the dynamic range, using extra measurements to calculate the bias, or various other problems. The typical equation used to remove bias is:

$$Vo(set) = (Vdrv/2) + Voffset + Vmeas \quad \text{(Eqn. 1)}$$

$$Vo(reset) = (Vdrv/2) + Voffset - Vmeas \quad \text{(Eqn. 2)}$$

$$Voffset + (Vdrv/2) = (Vo(set) + Vo(reset))/2 \quad \text{(Eqn. 3)}$$

$$Vmag = Vo(set) - (Voffset + (Vdrv/2)) \quad \text{(Eqn. 4)}$$

The terms Vo(set) and Vo(reset) are descriptions of the AMR bridge outputs. Equation 3 indicates the processing required to obtain the resultant voltage that is proportional to the external field. To obtain this resultant voltage a micro processor must manipulate 3 measurements to produce a valid output from the sensor. The repetition rate that Voffset must be measured at is controlled by several factors in the environment such as temperature and level of the external fields to be measured. The Set/Reset functions improve accuracy of the readings and reduce the noise level of the sensor. In rapidly-changing environments, Voffset must be calculated more often to keep the readings accurate as it is used in the final equation to calculate the output of the magnetometer measured level. Voffset can change at a rate of 2700 ppm per degree C. under normal circumstances. It can be seen in the final equation that the Voffset term directly effects the accuracy of the magnetometer measurement. Accordingly, it is desirable to provide correction transparency and temperature independence to the measurements being performed without loss of resolution or reduction in bandwidth.

SUMMARY OF THE INVENTION

In the present invention the term Voffset is not directly calculated. Instead the equation:

$$Vmag = (Vo(set) - Vo(reset))/2 \quad \text{(Eqn. 5)}$$

is used. From the previous equations 1 and 2, and from the equation:

$$Vmag = (Vo(set) - Vo(reset))/2 \quad \text{(Eqn. 6)}$$

it should be noted that reducing the equations below yields the same answer.

$$Vmag = (((Vdrv/2) + Voffset + Vmeas) - ((Vdrv/2) + Voffset - Vmeas))/2 \quad \text{(Eqn. 7)}$$

$$Vmag = ((Vmeas) - (-Vmeas))/2 \quad \text{(Eqn. 8)}$$

The terms Vo(set) and Vo(reset) are descriptions of the AMR bridge outputs. Equation 6 requires only a simple subtraction and division by 2 to obtain the voltage output that is proportional to the external field, without the use of a micro processor.

Equation 6 thus illustrates a scheme for obtaining a corrected result. The operation can be performed in a differential amplifier since a commutating demodulator provides both signals simultaneously. It should be noted that the Voffset term can also be output for the demodulator by simply using a summing amplifier with a gain of 0.5 to obtain this term. However, the scheme illustrated in equation 6 could not be performed easily without the present invention since both Vo(set) and Vo(reset) are not present in normal operation. It should be noted that the Voffset term is derived from the equation:

$$Voffset = (Vo(set) + Vo(reset))/2 \quad \text{(Eqn. 9)}$$

This output term can be obtained using a summing amplifier with the gain set to 0.5.

The present invention thus facilitates use of an AMR sensor without having to do significant additional processing to calculate the field strength of an applied magnetic field. This permits use of the AMR sensor as a direct replacement for the more common fluxgate (or flux-valve) magnetometer that produces a voltage proportional to an applied external field, and without having to perform set and reset calculations. This elimination of offset bias is independent of temperature and demonstrates the importance of the present invention, for example, for magnetic compassing where accurate angles are necessary. In addition, the present invention costs significantly less than conventional fluxgate designs and requires much less power to operate. Offset bias is thus removed in accordance with the present invention, with concurrent reductions in manufacturing costs compared with most fluxgate designs that require either special design considerations or temperature calibration to remove offset bias.

DETAILED DESCRIPTION OF THE INVENTION

Figure 1:
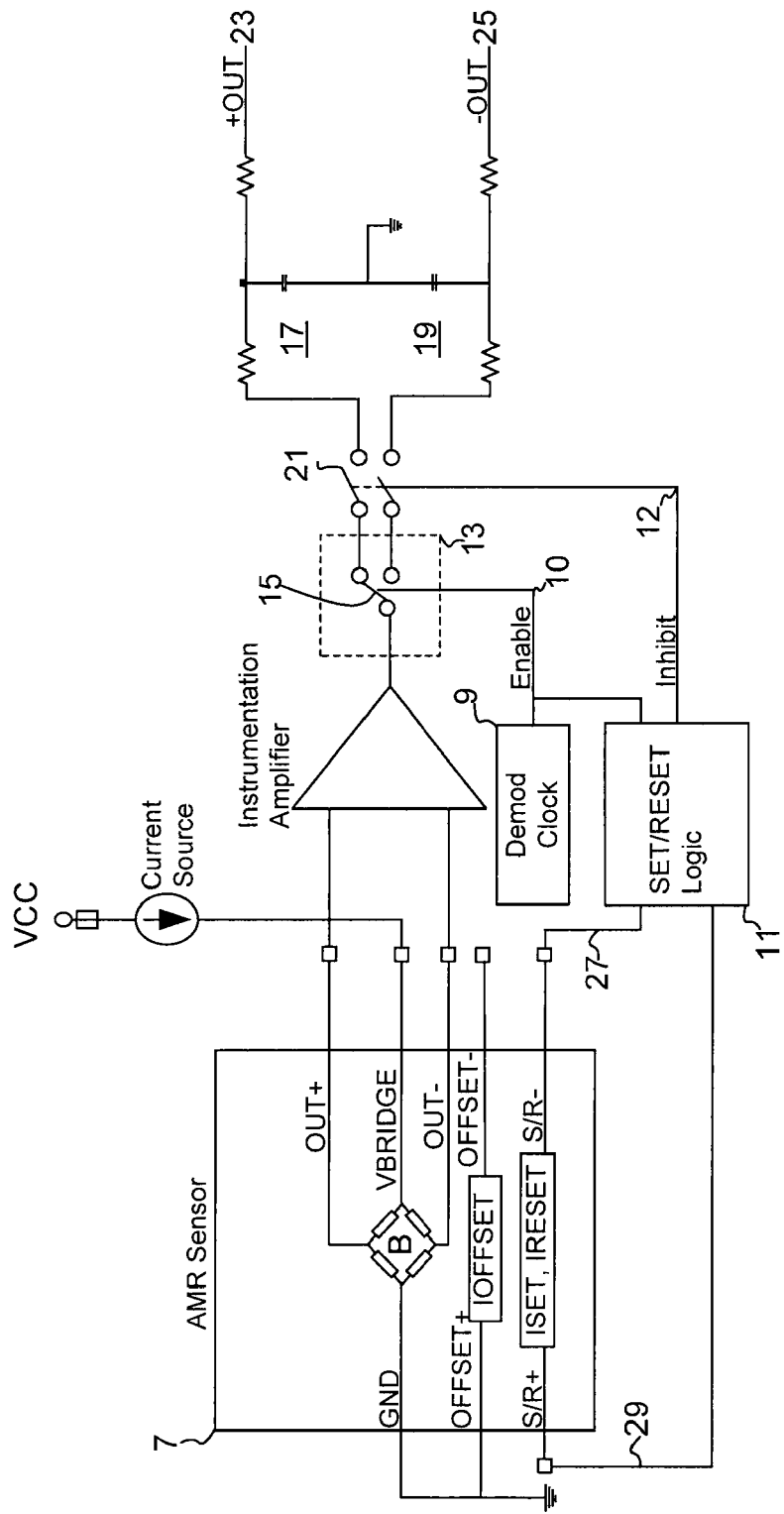
FIG. 1 is a block schematic diagram of one embodiment of the present invention.

Referring now to the block diagram in FIG. 1, there is shown a block schematic diagram of one embodiment of the present invention including a commutating demodulator. The demodulator clock drives the set and reset circuits 11 as well as a flip-flop circuit 13 that controls the commutating switch 15. The output of the switch 15 supplies two integrators 17, 19 that derive the differential signal. An inhibit switch 21 turns off the output signal from circuit 13 when the SET/RESET signal is present to eliminate this signal passing through to the outputs 23, 25.

This embodiment of the present invention allows direct measurements to be made from the sensor 7 in contrast to conventional schemes that require several intermediate measurements to be made to calculate sensor offset in order to correct the sensor output. In this embodiment, the sensor offset is removed by the commutating demodulator circuit of FIG. 1 that produces the sensor output as the differential signal 23, 25 and the offset as the common mode voltage 23, 25. In addition, the data can be taken in a continuous mode rather than sampled mode since the voltage is always present at the output 23, 25 of the demodulator.

Figure 2:
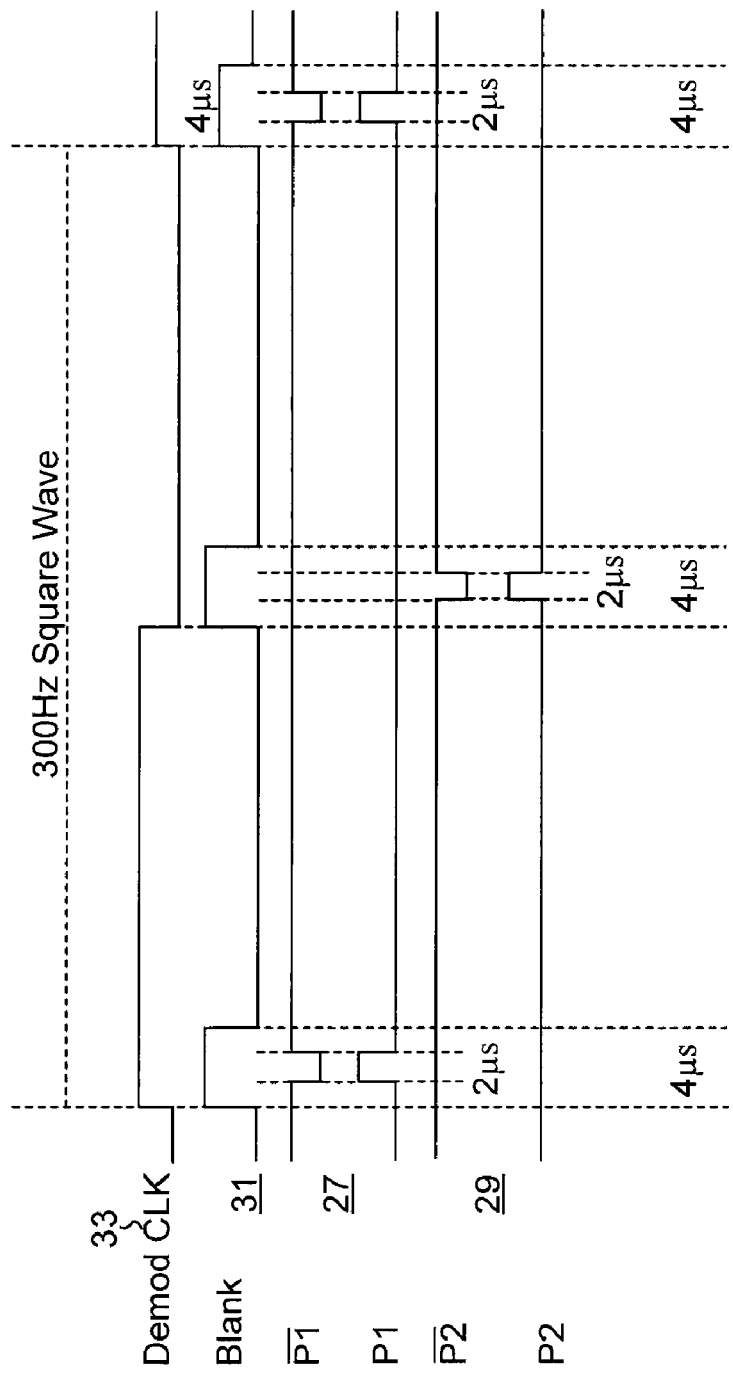
FIG. 2 is a graph illustrating timing of signals in a commutating demodulator according to the present invention.

Referring to the graph of FIG. 2, the Set/Reset signal 27, 29 toggles the commutating demodulator states. The SET/RESET signal 27, 29 is only 2 μsec wide and has little effect on the bandwidth of the system. The blanking circuit including switch 21 blocks the set/reset signal 27, 29 from appearing on the output of the demodulator. The Inhibit signal 12 from the SET/RESET circuit 11 serves as the blanking pulses 31 applied to the switch 21, and the Enable signal 10 is the Demod CLK signal 33. The Px signals are used to control a conventional bridge circuit formed of FET's connected in an 'H' configuration.

The Set/Reset signals are derived in conventional manner for operation of the H bridge, and the Set/Reset is not affected by temperature. This allows for a fast blanking signal. The short blanking pulse 31 allows operation to be transparent to a host data system, so synchronization with the operating signals is not necessary. During the blanking pulse 31 the integrators 17, 19 with switch 21 act as sample and hold circuits. R1, C1 and R3, C2 act as hold circuits during the blank pulse to block Set/Reset pulses from bleeding through to the outputs 23, 25.

The present invention is thus conducive to operation in multi-axis coherent detection systems, for example, using AMR sensors oriented along 3 orthogonal axes, as well as for servoing a system in which error signal is fed back to compensation coils disposed about a sensor to null the ambient field. In the case of such a servo system, the sensor is operated in a zero field, and the accuracy of bias reduction becomes extremely important as the sensor is operated at the real null point of the field. If the bias is incorrectly nulled, the sensor will be operating at other than the null point and will become sensitive to temperature variations. This is important for sensors operating over wide temperature ranges where sensor drift becomes important.

AMR sensors have little or no drift when operated at the null point, and with the demodulator circuit of the present invention, there is no temperature compensation needed since the circuit correctly reduces the offset bias to zero. The illustrated embodiment of the present invention produces differential outputs, and detected magnetic field strength is proportional to the differential voltage between the two outputs. If a single ended output is required, then a differential amplifier can be connected to receive the differential outputs for producing a single-ended output indicative of detected magnetic field strength.

What is claimed is:

1. Apparatus for operation with a magnetic field sensor that responds to applied set and reset input signals to produce set and reset output signals indicative of a sensed magnetic field, the apparatus comprising:

logic circuitry for alternately supplying set and reset input signals to the sensor;

an amplifier coupled to receive the set and reset output signals for producing an output;

a switch coupled to receive the output from the amplifier for alternately directing the output to first and second integrators during corresponding intervals of alternating supplies of set and reset input signals;

a clock coupled to the switch and to the logic circuitry for controlling alternate operations thereof; and a sampler coupled intermediate the switch and the first and second integrators and operable for intermittently supplying the alternately-directed output to the first and second integrators only during portions of corresponding intervals of alternating supplies of set and reset signals to the sensor.

2. Apparatus according to claim 1 in which a difference of levels of signals in the first and second integrators represents magnitude of the sensed magnetic field.

3. Apparatus according to claim 1 in which common mode level of signals in the first and second integrators represents offset about a reference level of the set and reset output signals from the magnetic field sensor.

4. Apparatus according to claim 3 in which each of the first and second integrators is connected to a common source of reference potential representing said reference level.

5. Apparatus according to claim 1 in which the sampler operates for intervals shorter than, and within the limits of, operating intervals of the switch.

* * * * *